(12) United States Patent
Abraham et al.

(10) Patent No.: US 6,624,659 B1
(45) Date of Patent: Sep. 23, 2003

(54) DYNAMICALLY UPDATING IMPEDANCE COMPENSATION CODE FOR INPUT AND OUTPUT DRIVERS

(75) Inventors: Isaac P. Abraham, Kent, WA (US); David R. Johnson, Olympia, WA (US); Jed Griffin, Olympia, WA (US); David Peart, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 670 days.

(21) Appl. No.: 09/608,529

(22) Filed: Jun. 30, 2000

(51) Int. Cl.[7] .......................................... H03K 19/0175
(52) U.S. Cl. ............................. 326/82; 326/83; 326/30
(58) Field of Search ............................. 326/26, 27, 30, 326/82, 83, 86, 87

(56) References Cited

U.S. PATENT DOCUMENTS 5,134,311 A * 7/1992 Biber et al. .................. 327/108
6,087,847 A * 7/2000 Mooney et al. ................ 326/30
6,384,621 B1 * 5/2002 Gibbs et al. ................... 326/30
6,424,175 B1 * 7/2002 Vangal et al. .................. 326/82

* cited by examiner

Primary Examiner—Don Le
(74) Attorney, Agent, or Firm—Blakely, Sokoloff, Taylor & Zafman LLP (57) ABSTRACT

In one embodiment of the invention, an update circuit having a bus driver to drive a bus dynamically receives an update compensation code. The bus driver receives data at a data clock signal. The update compensation code controls impedance matching at the bus driver according to the data. A code generator generates the update compensation code at a base clock signal. The base clock signal is synchronized with the data clock signal. The base clock signal has an update interval and a quiet interval. A distribution ring interface distributes the update compensation code to the update circuit synchronously with the base clock signal.

33 Claims, 5 Drawing Sheets

DYNAMICALLY UPDATING IMPEDANCE COMPENSATION CODE FOR INPUT AND OUTPUT DRIVERS

BACKGROUND

1. Field of the Invention

This invention relates to microprocessors. In particular, the invention relates to input/output drivers.

2. Description of Related Art

Compensation codes are used to compensate for any impedance mismatches at input/output (I/O) pads of I/O drivers. Impedance mismatches may be caused by several factors including type of process, junction temperature, die temperature profile, noise, power supply fluctuations, device age, warm-up variations, etc. When a circuit involving I/O drivers is functioning, these factors may affect the impedance of the individual I/O drivers causing undesirable effects such as noise, reflections, cross-talks, ringing, overshoots and undershoots. To maintain reasonable balanced impedance, compensation codes are updated periodically.

Current techniques for updating compensation code are static in that the compensation codes are sent to the I/O drivers at a fixed, predetermined schedule. One approach is to update using a special reserved cycle (SRC). At designated times, the SRC is initiated, the transmission of data on the bus is stopped and the I/O drivers are tri-stated. Then, the updated compensation codes are sent to the I/O drivers. This approach has a number of disadvantages. First, the transmission of data is temporarily suspended, resulting in slow transmission rate. Second, special circuitry is required to initiate the SRC. Third, the core of the device has to have some routing mechanism to route pending transactions into queues prior to code update. This approach therefore results in complex circuitry and degraded performance.

BRIEF DESCRIPTION OF THE DRAWINGS

The features and advantages of the present invention will become apparent from the following detailed description of the present invention in which.

DESCRIPTION

The present invention is a method and apparatus to update the impedance compensation code at a bus driver of an input/output (I/O) subsystem dynamically. The technique partitions the circuit topology into multiple blocks and propagates the compensation code from one block to the next in a pipelined manner. The dynamic update compensation code circuit includes a code generator, a distribution ring circuit, and an update circuit. By dividing the circuit into well-defined blocks, the clocking scheme of various elements in the circuit is easily controlled. The code generator generates the update compensation code at a base clock signal. The base clock signal defines an update interval and a quiet interval. The distribution ring circuit propagates the update compensation code to the update circuit and keeps the update compensation code stable during the update. The update circuit includes a code latch circuit which latches the update compensation code, a latch enable circuit to enable the code latch circuit, a gating circuit to gate the compensation code with the data, and a bus driver to drive the data to the bus. The bus driver is updated during an update window which is defined within the stable time of the update compensation code. This update window spans part of the update interval and part of the quiet interval. The bus driver includes a p-device and an n-device. The code latch, the latch enable, and the gate enable circuits, each has two circuits corresponding to the p-device and the n-device. When the data is such that the p-device is active and the n-device is inactive, the update is done on the inactive n-device. Similarly, when the data is such that the p-device is inactive and the n-device is active, the update is done on the inactive p-device. The updating is performed by positioning the latching of the corresponding update code at the middle point of the data so that timing requirements are satisfied.

The technique thus eliminates the need for the core and the protocol data transmission engine to set aside any special cycles for updating the I/Os with the latest compensation code. Accordingly, the I/O subsystem becomes more intelligent and independent from the core. The data transfer rate becomes faster and the hardware is reduced.

In the following description, for purposes of explanation, numerous details are set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention.

Figure 1:
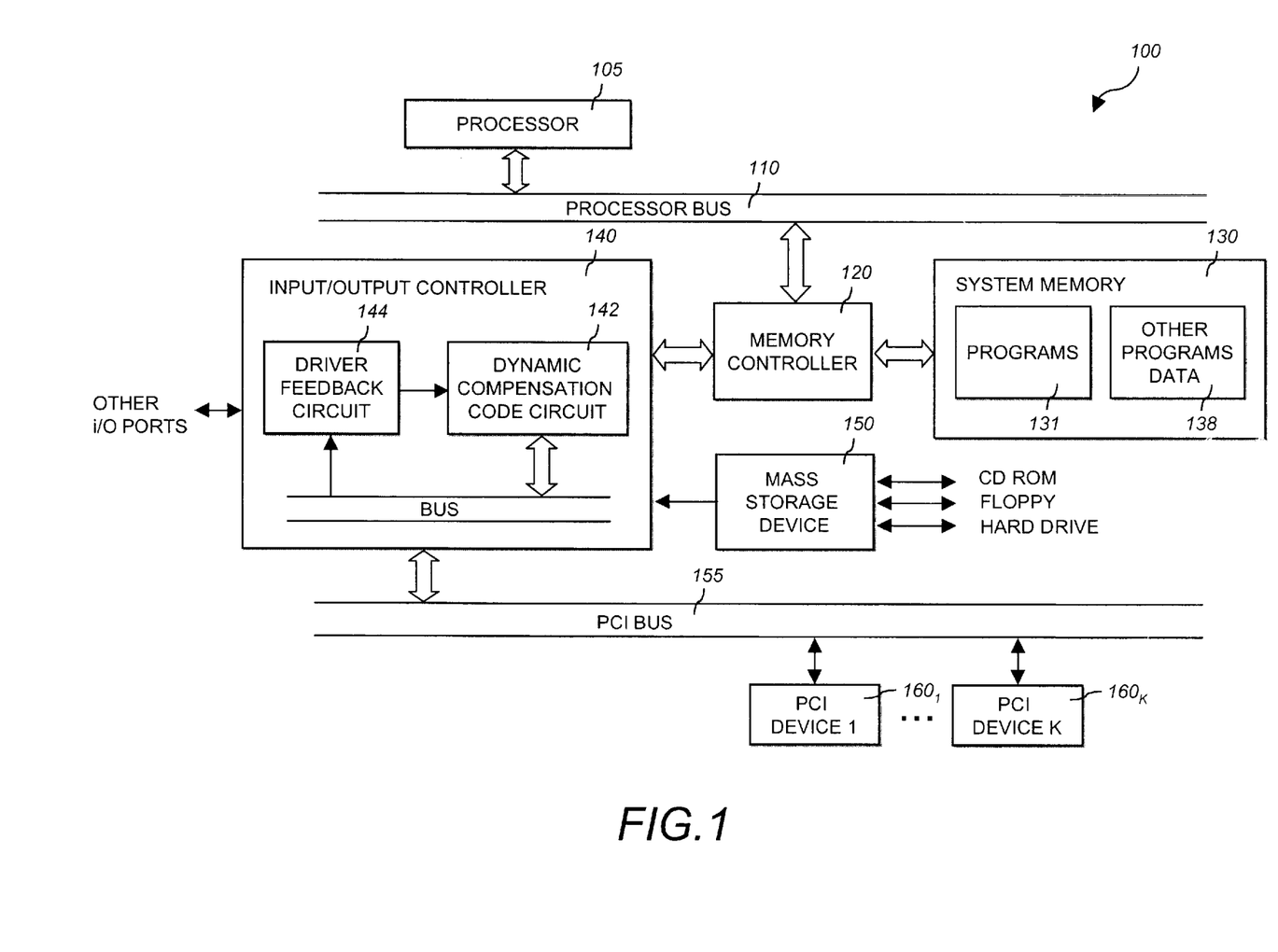
FIG. 1 is a diagram illustrating a system in which one embodiment of the invention can be practiced.

FIG. 1 is a diagram illustrating a system 100 according to one embodiment of the present invention. The system 100 includes a processor 105, a processor bus 110, a memory controller 120, a system memory 130, an input/output (I/O) controller 140, a mass storage device 150, a peripheral component interconnect (PCI) bus 155, and K PCI devices $160_1$ to $160_K$.

The processor 105 represents a central processing unit of any type of architecture, such as complex instruction set computers (CISC), reduced instruction set computers (RISC), very long instruction word (VLIW), or hybrid architecture. The processor 105 interfaces with the memory controller 120 and the I/O controller 140 via the processor bus 110. The processor bus 110 may support single processor or multiple processors.

The memory controller 120 and the I/O controller 140 typically form an integrated chipset which includes a number of interface circuits to allow the host processor 105 access to the system memory 130 and the PCI bus 155. The system memory 130 represents one or more mechanisms for storing information. For example, the system memory 130 may include non-volatile or volatile memories. Examples of these memories include flash memory, read only memory (ROM), or random access memory (RAM). The system memory 130 may contain a program 131 and other programs and data 138. Of course, the system memory 130 preferably contains additional software (not shown), which is not necessary to understanding the invention. The I/O controller 140 provides interface to I/O devices and the PCI bus 155. The I/O controller 140 includes a dynamic compensation code circuit 142 and a driver feedback circuit 144. The dynamic compensation code circuit 142 compensates the impedance at the bus drivers that drive the bus such as the PCI bus 155. The driver feedback circuit 144 provides impedance or voltage information at the bus to the dynamic compensation code circuit 142 to allow appropriate determination of compensation codes. The I/O ports may allow interface to I/O devices such as audio codec, modem codec, universal serial bus (USB) devices. The mass storage device 150 includes CD-ROM, floppy diskettes, and hard drives. The mass storage device 150 provides access to computer readable media that contain program code to perform designated functions.

The PCI devices $160_1$ to $160_K$ are devices to perform dedicated or general purpose tasks. Examples of PCI devices include direct memory access controller (DMAC), network interface, and media interface devices. The network interface connects to communication networks such as the Internet. The Internet provides access to on-line service providers, Web browsers, and other network channels. The media interface provides access to audio and video devices.

Figure 2:
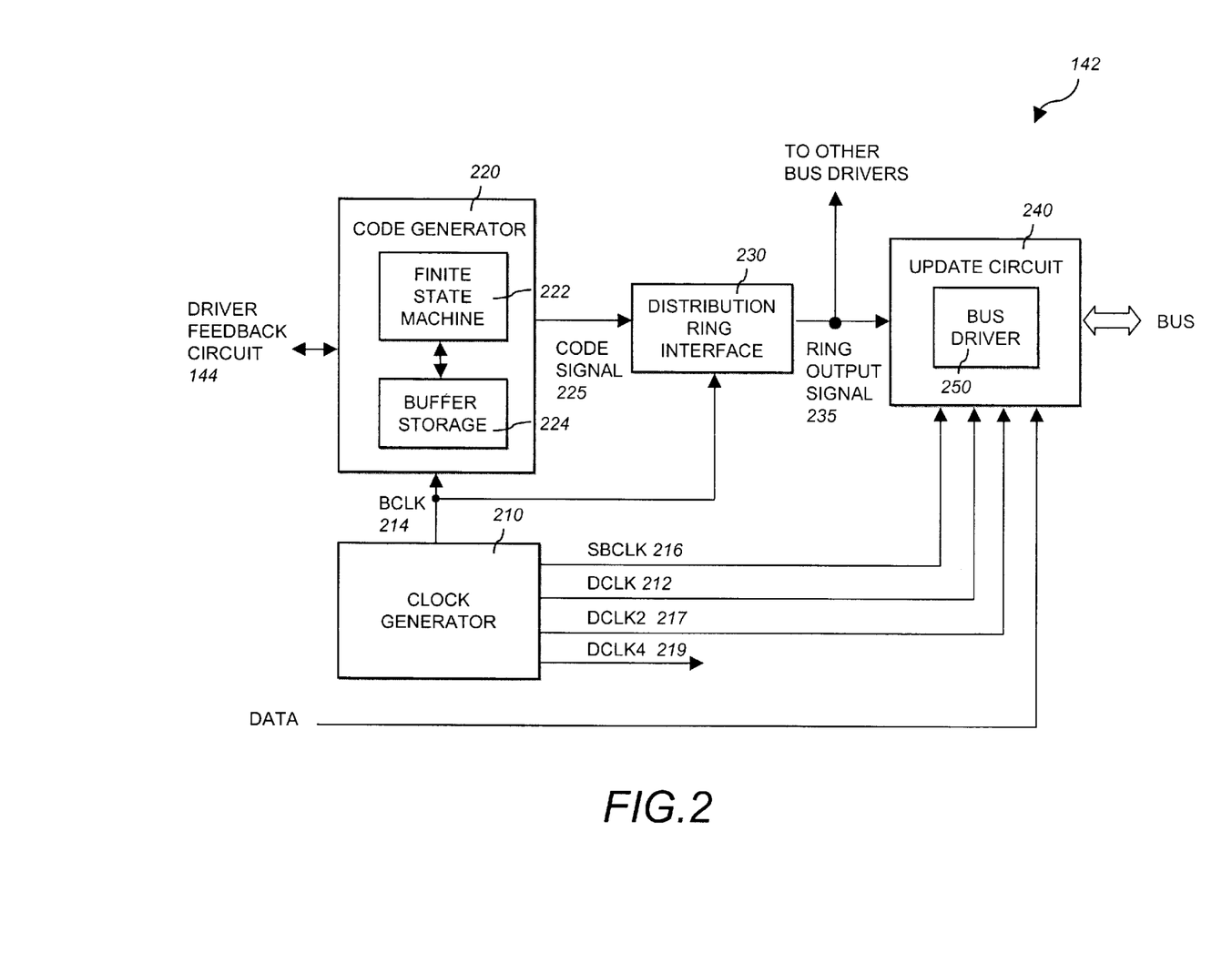
FIG. 2 is a diagram illustrating a dynamic compensation code circuit shown in FIG. 1 according to one embodiment of the invention.

FIG. 2 is a diagram illustrating the dynamic compensation code circuit 142 shown in FIG. 1 according to one embodiment of the invention. The dynamic compensation code circuit 142 includes a clock generator 210, a code generator 220, a distribution ring interface 230, and an update circuit 240.

The dynamic compensation code circuit 142 updates the compensation code dynamically to match or control impedance matching at the bus drivers interfacing to the I/O bus. The update is carried out while the data are being transmitted or received at the bus without the need to temporarily stop some or all bus transactions. The overall architecture of the dynamic compensation code circuit 142 is based on a pipeline approach. The update compensation code is sent to the bus driver in a pipelined fashion through a number of well-defined blocks. The clocking of the compensation code is timed in synchronism with the flow of the code and the data being sent or received. In addition, the compensation code is updated at the inactive driver according to the data. The three well-defined blocks that form the pipeline chain include the code generator 220, the distribution ring interface 230, and the update circuit 240. Note that the distribution ring interface 230 is also interfaced to other drivers in the I/O subsystem.

The clock generator 210 generates a number of clock signals to provide timing references for various elements in the circuit 142. These clock signals include a data clock (DCLK) signal 212, a base clock (BCLK) signal 214, a shifted base clock signal (SBCLK) 216. The data clock signal 212 is used to clock the data out to the bus from a data transmitter/receiver logic circuit. The base clock signal 214 preferably has an approximately 50% duty cycle with tolerance +/−5%. In other words, the high and low times of the base clock signal 212 are approximately equal. The SBCLK signal 216 is the BCLK signal 214 shifted by some predetermined amount, e.g., one half period of the DCLK signal 212. This can be accomplished by clocking the BCLK signal 214 by the inverted DCLK signal. Other clock signals include a DCLK2 signal 217 and a DCLK4 signal 219. The DCLK2 and DCLK4 signals 217 and 219 are clock signals having periods that are two and four times of the DCLK signal 212, respectively. The DCLK signal 212, the BCLK signal 214, the SBCLK signal 216, the DCLK2 signal 217, and the DCLK4 signal 219 are synchronized and preferably have approximately 50% duty cycle +/−5%. In one embodiment, the clock generator 210 is implemented as a fast binary counter with look-ahead circuitry, clocked by the fastest clock signal, such as the DCLK signal 212, or another fast clock signal which is twice faster than the DCLK signal 212. Alternatively, the clock generator 210 may be implemented by a series of D flip-flops arranged in cascade with additional delays at each clock signal with respect to the fastest clock signal, e.g., the DCLK signal 212.

The code generator 220 receives the driver feedback information from the driver feedback circuit 144 (FIG. 1) and generates a code signal 225 which carries an update compensation code at the base clock signal 214. The code generator 220 includes a finite state machine (FSM) 222 and a buffer storage 224. The driver feedback information provides information to the FSM 222 to determine the appropriate compensation code. The update compensation codes may then be stored in the buffer storage 224 for later use. Alternatively, the buffer storage 224 may contain update compensation codes that have been determined in advance according to the feedback information or some default conditions (e.g., reset). In one embodiment, the FSM 222 is clocked by the BCLK signal 214 and generates the code signal 225 at the rising edge of the BCLK signal 214.

The distribution ring interface 230 distributes the update compensation code to the update circuit synchronously with the base clock signal 214. To satisfy the set-up and hold time requirements of various registers and flip-flops in the circuit, the distribution ring interface 230 generates a ring output signal 235 using the BCLK 214 signal. The distribution ring interface 230 may be implemented by a number of registers and buffers with sufficient driving capability to drive other update circuits in the I/O subsystem. The ring output signal 235 essentially carries the update compensation code delayed by an appropriate delay.

The update circuit 240 receives the update compensation code dynamically, i.e., when the data are being transmitted or received at the bus. The update circuit 240 includes a bus driver 250 which drives the bus. The bus driver 250 receives the data at the DCLK signal 212. The update compensation code controls impedance matching at the bus driver 250 according to the data. The bus driver also receives the SBCLK signal 216, DCLK2 signal 217, and the DCLK4 signal 219 to provide various timing references.

Figure 3:
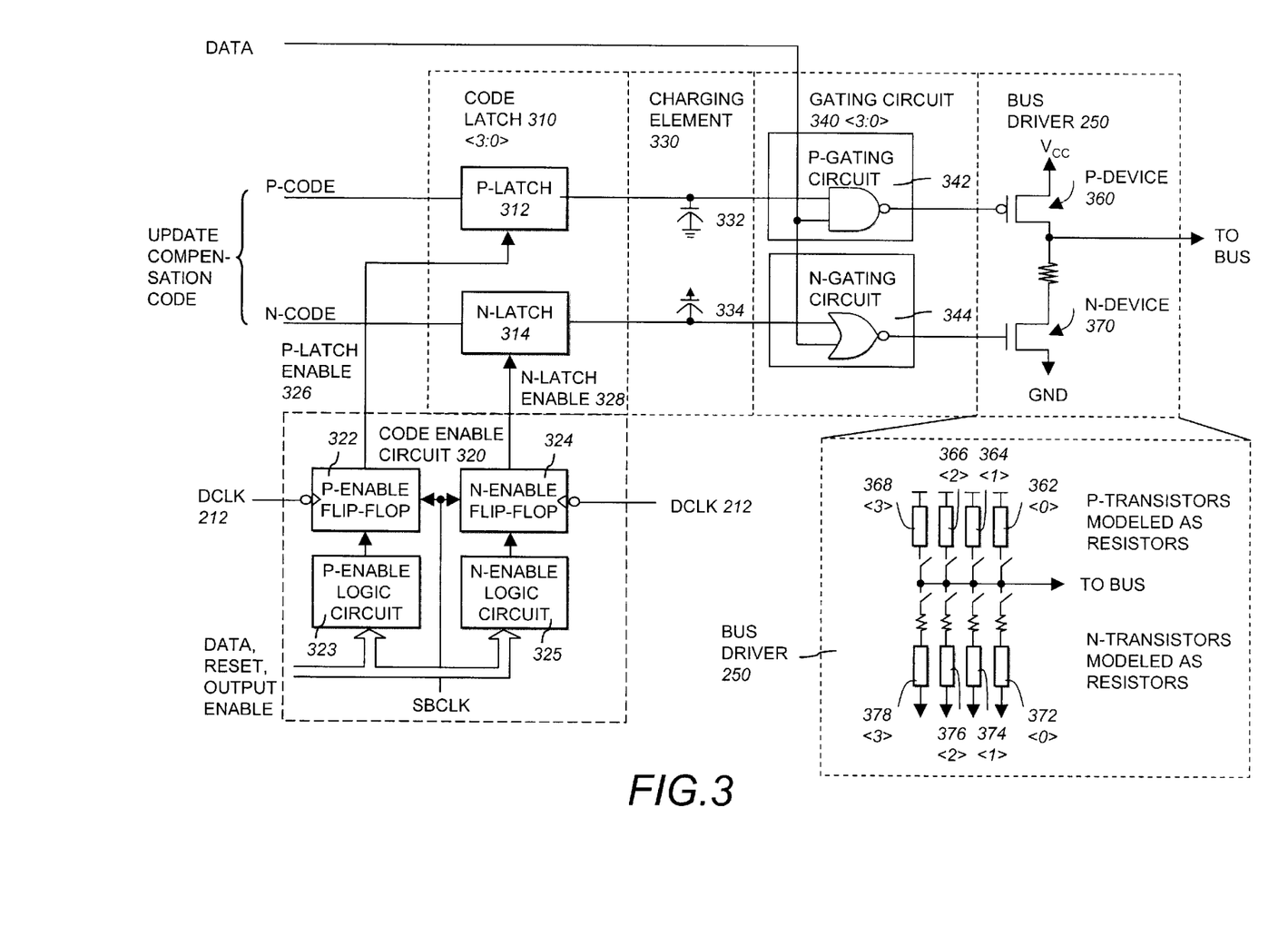
FIG. 3 is a diagram illustrating an update circuit shown in FIG. 2 according to one embodiment of the invention.

FIG. 3 is a diagram illustrating the update circuit 240 shown in FIG. 2 according to one embodiment of the invention. The update circuit 240 includes a code latch 310, a code enable circuit 320, a charging element 330, a gating circuit 340, and the bus driver 250. The diagram shows 4-bit configuration <3:0>for the update compensation code.

The bus driver 250 includes a p-device 360 and an n-device 370. The p-device 360 and the n-device 370 operate to drive the bus to a low logic state, a high logic state, and a high impedance state (e.g., tri-state). When the bus driver 250 drives a logical 1, the p-device 360 is active and the n-device 370 is inactive. When the bus driver 250 drives a logical 0, the p-device 360 is inactive and the n-device 370 is active. The update compensation code includes a p-code and an n-code which correspond to the p-driver 360 and the n-driver 370, respectively. In one embodiment, each of the p-device 360 and the n-device 370 may be implemented by a number of transistors connected in parallel. For example, the p-device 360 may include four transistors 362, 364, 366, and 368. Similarly, the n-device 370 may include four transistors 372, 374, 376, and 378. The p-code and the n-code for the p-device 360 and the n-device 370 are 4-bit. The number of transistors depends on criteria such as geometry constraints and impedance matching.

The code latch 310 stores the update compensation code during an update window. The update window is defined as a time interval during which the bus driver is updated by the update compensation code. In one embodiment, the update window spans the later part of the high time and the early part of the low time of the BCLK signal 214. The code latch 310 includes a p-latch 312 and an n-latch 314. The p-latch 312 and the n-latch 314 store the p-code and the n-code, respectively. The p-code and the n-code are the update compensation codes for the p-device and the n-device at the bus driver 250. For 4-bit p-code and n-code, the p-latch 312 and n-latch 314 each consists of 4-bit latch <3:0>. The p-latch 312 and the n-latch 314 are essentially the same with different enable signals. The p-latch 312 and the n-latch 314 may be implemented as transparent latches with enable. For example, when the enable signal is asserted (e.g., HIGH), the latch becomes transparent allowing the input to pass through and appear at the output with some propagation delay; when the enable signal is de-asserted (e.g., LOW), the output remains unchanged, i.e., latching the previously loaded information.

The code enable circuit 320 is coupled to the code latch to generate the enable signals to enable latching the update compensation code. The code enable circuit 320 receives the data, reset signal, and output enable control signal from the transmitter/receiver logic circuit. For example, during reset, there is no data but the bus driver needs to be loaded with some default compensation code. The code enable circuit 320 therefore generates the enable signals to the code latch 310 to allow latching the initial compensation code as provided by the code generator 220 (FIG. 2). The code enable circuit 320 includes a p-enable flip-flop 322, a p-enable logic circuit 323, an n-enable flip-flop 324, and an n-enable logic circuit 325. The p-enable flip-flop 322 is coupled to the p-latch 312 to generate a p-latch enable signal 326 when the data is at a first logical state, e.g., LOW. The p-enable logic circuit 323 asserts the enable signal based on an output enable signal, a reset signal, and the data. The logic equations are based on some specified conditions. For example, the enable signal is the same as the data when the output enable and the reset signals are negated. Another example is the enable signals are asserted when the reset signal is asserted indicating that some default compensation code is going to be updated. The p-latch enable signal 326 enables the p-latch 312 to allow the p-code to pass through when the data bit is at a logical LOW. The n-enable flip-flop 324 is coupled to the n-latch 314 to generate an n-latch enable signal 328 when the data is at a second logical state, e.g., HIGH. The n-latch enable signal 328 enables the n-latch 314 to allow the n-code to pass through when the data bit at a logical HIGH. The n-enable logic circuit 325 asserts the enable signal based on an output enable signal, a reset signal, and the data. The enabling process is such that when the data is at a logical state that corresponds to an active device at the bus driver, the compensation code is updated at the inactive device. To provide safety margin for timing, the p-enable and n-enable flip-flops 322 and 324 are clocked at the negative edge of the DCLK signal, indicated by a circle at the clock input, such that the p-latch and n-latch enable signals are clocked out at a midpoint of the data. In addition, the p-enable and n-enable flip-flops 322 and 324 are enabled (e.g., reset) by the SBCLK signal synchronously.

The charging element 330 is the parasitic capacitance at the input to the gating circuit 340. This parasitic capacitance provides a charging and discharging path for the update compensation code from the code latch 310. The charging element 320 includes capacitors 332 and 334 corresponding to the p-latch 312, input of 342, n-latch 314, and input to 344.

The gating circuit 340 is coupled to the code latch 310 to gate the update compensation code by the data. The gating circuit 340 includes a p-gating circuit 342 and an negating circuit 344 corresponding to the p-device 352 and the n-device 354, respectively. This gating action is performed together with the enabling action by the code enable circuit 320 such that when the data is gated to inactivate a driver device, the corresponding latch is enabled, allowing the compensation code to go through. In one embodiment, the p-gating circuit 342 is implemented by a NAND gate and the n-gating device is implemented by a NOR gate.

Figure 4:
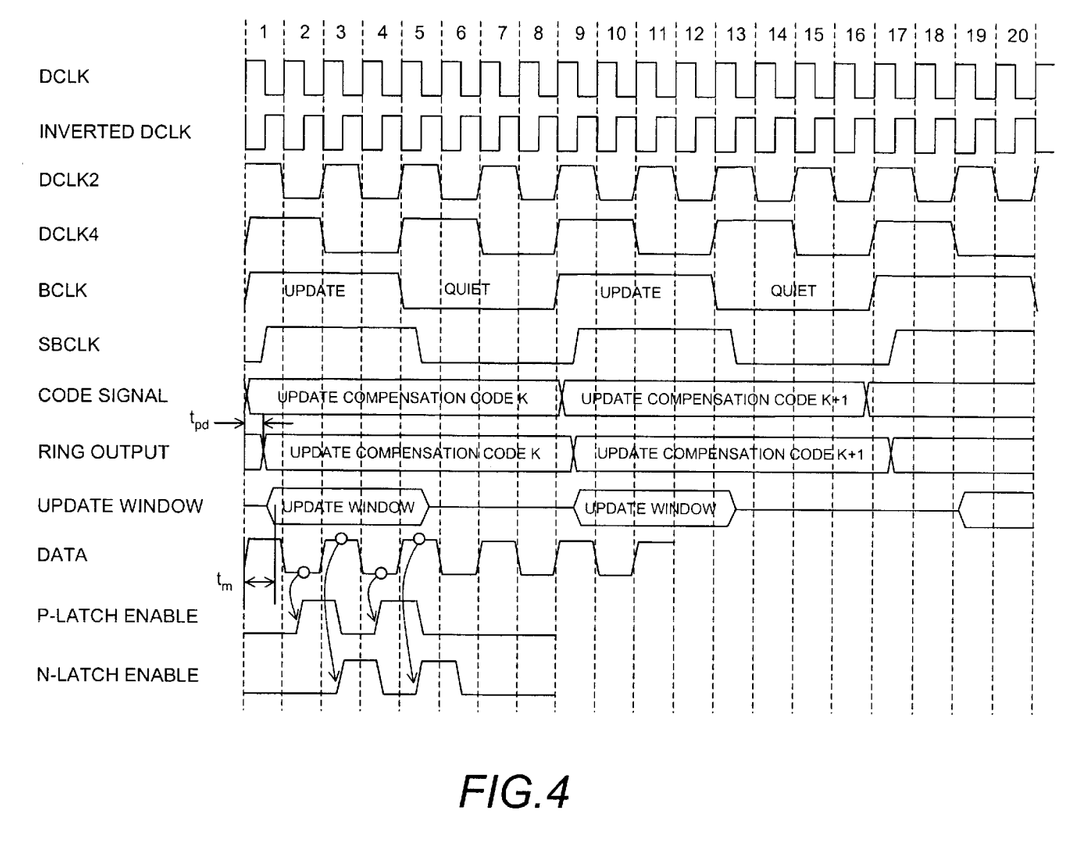
FIG. 4 is a timing diagram illustrating timing relationships of enable signals and other clock signals according to one embodiment of the invention.

FIG. 4 is a timing diagram illustrating timing relationships of enable signals and various clock signals according to one embodiment of the invention. The timing diagram shows timing relationships among the DCLK, DCLK2, DCLK4, BCLK, SBCLK, code, ring output, update window, data, p-latch enable, and n-latch enable signals.

The clock signals DCLK, DCLK2, DCLK4, BCLK, and SBCLK are provided by the clock generator 210 (FIG. 2). In one embodiment, the frequencies of the DCLK, DCLK2, DCLK4, BCLK, and SBCLK signals are 533 MHz, 266 MHz, 133 MHz, 66 MHz, and 66 MHz, respectively. The SBCLK signal is the BCLK signal shifted by one period of the DCLK signal.

The BCLK signal has an update interval and a quiet interval corresponding to the high and low times, respectively. The update interval is when the update compensation code is generated and the bus driver starts to be updated. The quiet interval is when the update begins to be terminated. The code signal carries the update compensation code provided by the code generator 220 (FIG. 2). The code signal is clocked at the rising edge of the BCLK signal. The update compensation code is stable over the entire period of the BCLK signal. The ring output signal is clocked at the rising edge of the BCLK signal. The half period of the DCLK signal essentially is greater than the propagation delay caused by the register or flip-flop in the code generator, the transmission delay from the code generator to the ring distribution circuit, and the set-up time of the register or flip-flop in the ring distribution circuit that clock in the code signal. The ring output signal is therefore stable over almost the entire period of the BCLK signal with a propagation delay of $t_{pd}$.

The update window is the time interval within the stable time of the update compensation code as carried by the ring output signal. Essentially the update window is selected so that the update can be safely completed within a known time interval. In one embodiment, the update window is within the first half of the SBLCK period, e.g., the high time interval. The update window has a margin time delay $t_m$ to ensure that the update propagation code can propagate to the code enable circuit to meet the set-up time requirement. In other embodiments, the update window may span the later part of the update interval and the early part of the quiet interval of the BCLK signal.

The n-latch enable and p-latch enable signals are conditioned on the data. The n-latch enable signal is asserted high when the data is at logical 1, driving the p-device. During this time, the n-latch is transparent, allow the n-code to pass through and update the compensation code. The p-latch enable signal is asserted high when the data is at logical 0, driving the n-device. During this time, the p-latch is transparent, allowing the p-code to pass through and update the compensation code. The p-latch and n-latch enable signals are asserted at a point in the middle of the data to allow time for the data to be stabilized. In the timing diagram, the eight bits of data transmitted to the driver are 1 0 1 0 1 0 1 0, but the update is done for half of the data because it is not necessary to update the compensation code as often as the data rate. At the end of the update window, the p-enable and n-enable flip-flops are reset synchronously by the SBLCK. Since the reset is perform synchronously, the n-latch enable signal is still asserted for a full DCLK period before being reset LOW together with the p-latch enable signal.

Figure 5:
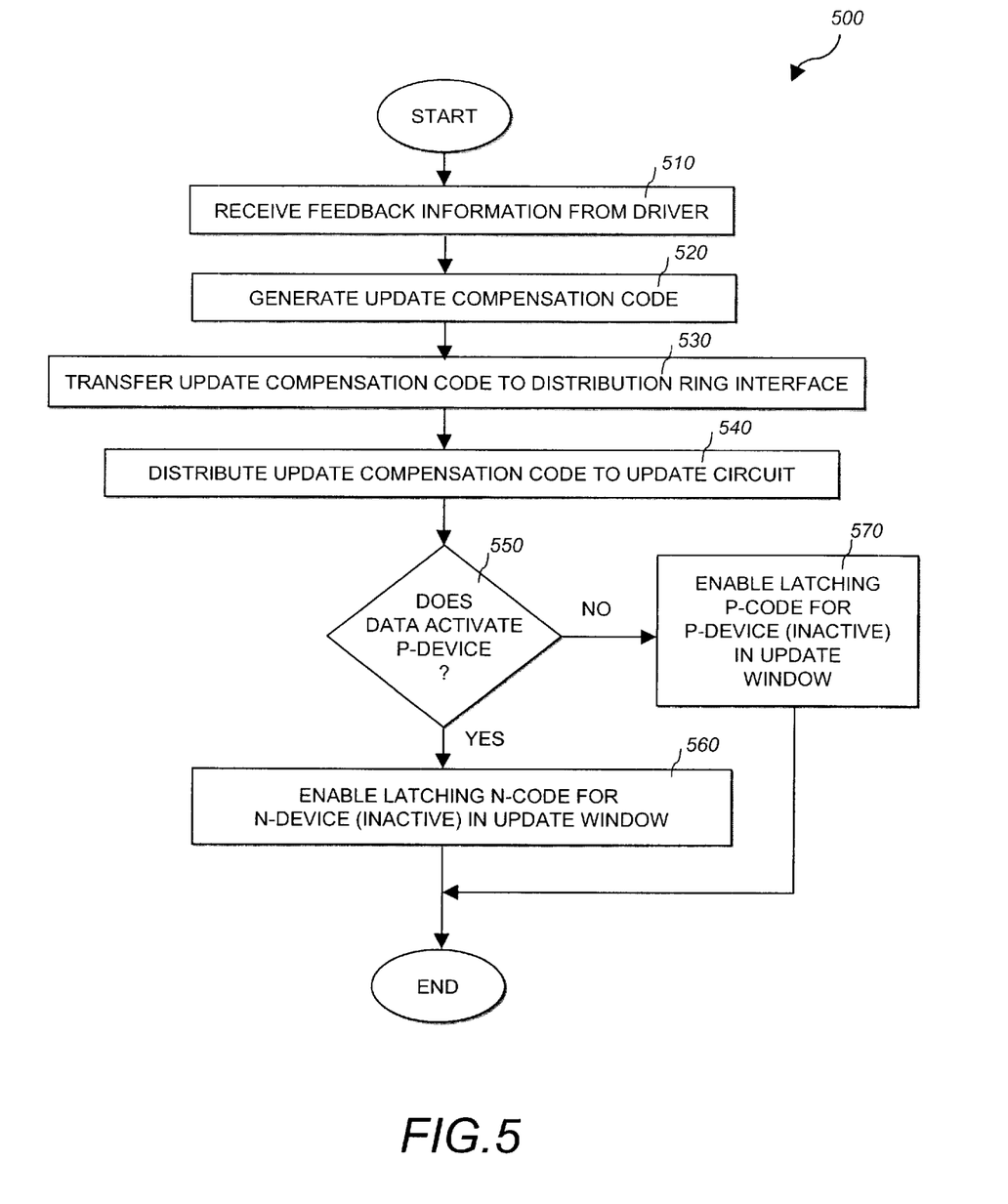
FIG. 5 is a flowchart illustrating a code update process according to one embodiment of the invention.

FIG. 5 is a flowchart illustrating a code update process 500 according to one embodiment of the invention.

Upon START, the process 500 receives the feedback information from the bus driver (Block 510). Then, the process generates the update compensation code using the feedback information (Block 520). The update compensation code is generated by the code generator at the base clock signal and includes the p-code and the n-code. Next, the process 500 transfers the update compensation code to the distribution ring (Block 530). The distribution ring stores the update compensation code and distributes the update compensation code to the update circuit (Block 540).

Next, the process 500 determines if the data activates the p-device in the bus driver (Block 550). If so, the process 500 enables latching the n-code for the inactive n-device in the bus driver in the update window (Block 560), and is then terminated. Otherwise, the data activates the n-device in the bus driver, and the process 500 enables latching the p-code for the inactive p-device in the update window (Block 570). The process 500 is then terminated.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. An apparatus comprising:
    an update circuit having a bus driver driving a bus to dynamically receive an update compensation code, the bus driver receiving data at a data clock signal, the update compensation code controlling impedance matching at the bus driver according to the data;
    a code generator to generate the update compensation code at a base clock signal, the base clock signal being synchronized with the data clock signal, the base clock signal having an update interval and a quiet interval; and
    a distribution ring interface coupled to the code generator to distribute the update compensation code to the update circuit synchronously with the base clock signal.

2. The apparatus of claim 1 wherein the update circuit comprises:
    a code latch coupled to the bus driver to latch the update compensation code during an update window;
    a code enable circuit coupled to the code latch to generate a latch enable signal according to the data during the update window, the latch enable signal enabling the code latch; and
    a gating circuit coupled to the code latch to gate the update compensation code by the data.

3. The apparatus of claim 2 wherein the bus driver comprises a p-device and an n-device to drive the bus to a low logic state, a high logic state, and a high impedance state.

4. The apparatus of claim 3 wherein the update compensation code includes a p-code and an n-code, the p-code updating the p-device when the p-device is inactive, the n-code updating the n-device when the n-device is inactive.

5. The apparatus of claim 4 wherein the code latch comprises:
    a p-latch to latch the p-code during the update window; and
    an n-latch to latch the n-code during the update window.

6. The apparatus of claim 5 wherein the enable circuit comprises:
    a p-enable circuit coupled to the p-latch to generate a p-latch enable signal when the data is at a first logical state, the p-latch enable signal enabling the p-latch; and
    an n-enable circuit coupled to the n-latch to generate an n-latch enable signal when the data is at a second logical state, the n-latch enable signal enabling the n-latch.

7. The apparatus of claim 5 wherein the gating circuit comprises:
    a p-gating circuit coupled to the p-latch to gate the p-code by the data to drive the p-device; and
    an n-gating circuit coupled to the n-latch to gate the n-code by the data to drive the n-device.

8. The apparatus of claim 5 wherein the update circuit further comprises:
    a p-charging element coupled to the p-latch to provide a charging and discharging path; and
    an n-charging element coupled to the n-latch to provide a charging and discharging path.

9. The apparatus of claim 2 wherein the code enable circuit generates the latch enable signal at a middle point of the data.

10. The apparatus of claim 1 wherein the code generator comprises:
    a finite state machine to control generating the update compensation code based on feedback information on the bus from the bus driver, the update compensation code being latched at the base clock signal.

11. The apparatus of claim 1 wherein the code ring comprises:
    a buffer to buffer the update compensation code.

12. The apparatus of claim 2 wherein the update interval and the quiet interval are approximately equal.

13. The apparatus of claim 12 wherein the update window is within the update interval delayed by a delay interval.

14. A method comprising:
    receiving data at a data clock signal;
    dynamically receiving an update compensation code, the update compensation code controlling impedance matching at a bus driver according to the data;
    generating the update compensation code at a base clock signal, the base clock signal being synchronized with the data clock signal, the base clock signal having an update interval and a quiet interval; and
    distributing the update compensation code to the update circuit synchronously with the base clock signal.

15. The method of claim 14 wherein receiving the update compensation code comprises:
    latching the update compensation code during an update window;

generating a latch enable signal according to the data during the update window, the latch enable signal enabling the code latch; and gating the update compensation code by the data.

16. The method of claim 15 wherein receiving the data comprises:

driving the bus to a low logic state, a high logic state, and a high impedance state by a p-device and an n-device.

17. The method of claim 16 wherein the update compensation code includes a p-code and an n-code, the p-code updating the p-device when the p-device is inactive, the n-code updating the n-device when the n-device is inactive.

18. The method of claim 17 wherein latching the update compensation code comprises:

latching the p-code during the update window by a p-latch; and latching the n-code during the update window by an n-latch.

19. The method of claim 18 wherein generating the latch enable signal comprises:

generating a p-latch enable signal when the data is at a first logical state, the p-latch enable signal enabling the p-latch; and generating an n-latch enable signal when the data is at a second logical state, the n-latch enable signal enabling the n-latch.

20. The method of claim 18 wherein gating the update compensation code comprises:

gating the p-code by the data to drive the p-device; and gating the n-code by the data to drive the n-device.

21. The method of claim 18 wherein receiving the update compensation code further comprises:

providing a charging and discharging path for the p-latch; and providing a charging and discharging path for the n-latch.

22. The method of claim 15 wherein generating the latch enable signal comprises generating the latch enable signal at a middle point of the data.

23. The method of claim 14 wherein generating the update compensation code comprises:

controlling generating the update compensation code based on feedback information on the bus from the bus driver, the update compensation code being latched at the base clock signal.

24. The method of claim 14 wherein distributing the update compensation code comprises:

buffering the update compensation code.

25. The method of claim 15 wherein the update interval and the quiet interval are approximately equal.

26. The method of claim 25 wherein the update window is within the update interval delayed by a delay interval.

27. A circuit comprising:

a driver feedback circuit coupled to a bus driver driving a bus to provide feedback information; and a dynamic compensation code circuit coupled to the driver feedback circuit, the dynamic compensation code circuit comprising:

an update circuit having the bus driver to dynamically receive an update compensation code, the bus driver receiving data at a data clock signal, the update compensation code controlling impedance matching at the bus driver according to the data, a code generator to generate the update compensation code at a base clock signal using the feedback information, the base clock signal being synchronized with the data clock signal, the base clock signal having an update interval and a quiet interval, and a distribution ring interface coupled to the code generator to distribute the update compensation code to the update circuit synchronously with the base clock signal.

28. The circuit of claim 27 wherein the update circuit comprises:

a code latch coupled to the bus driver to latch the update compensation code during an update window;

a code enable circuit coupled to the code latch to generate a latch enable signal according to the data during the update window, the latch enable signal enabling the code latch; and a gating circuit coupled to the code latch to gate the update compensation code by the data.

29. The circuit of claim 28 wherein the code enable circuit generates the latch enable signal at a middle point of the data.

30. The circuit of claim 27 wherein the code generator comprises:

a finite state machine to control generating the update compensation code based on feedback information on the bus from the bus driver, the update compensation code being latched at the base clock signal.

31. The circuit of claim 27 wherein the code ring comprises:

a buffer to buffer the update compensation code.

32. The circuit of claim 28 wherein the update interval and the quiet interval are approximately equal.

33. The circuit of claim 28 wherein the update window is within the update interval delayed by a delay interval.

* * * * *

UNITED STATES PATENT AND TRADEMARK OFFICE
CERTIFICATE OF CORRECTION

PATENT NO. : 6,624,659 B1
DATED : September 23, 2003
INVENTOR(S) : Abraham et al.

It is certified that error appears in the above-identified patent and that said Letters Patent is hereby corrected as shown below:

Column 5,
Line 53, after "data bit", insert -- is --.

Column 6,
Line 8, delete "negating", insert -- n-gating --.

Signed and Sealed this

Second Day of December, 2003

JAMES E. ROGAN
*Director of the United States Patent and Trademark Office*